United States Patent [19]
Tam

[11] Patent Number: 4,680,738
[45] Date of Patent: Jul. 14, 1987

[54] MEMORY WITH SEQUENTIAL MODE

[75] Inventor: Aloysius T. Tam, Sunnyvale, Calif.

[73] Assignee: Advanced Micro Devices, Inc., Sunnyvale, Calif.

[21] Appl. No.: 760,712

[22] Filed: Jul. 30, 1985

[51] Int. Cl.$^4$ .................................................. G11C 8/00
[52] U.S. Cl. ...................................... 365/239; 365/230
[58] Field of Search ................ 365/189, 230, 233, 239, 365/240

[56] References Cited

U.S. PATENT DOCUMENTS 4,281,401 7/1981 Redwine et al. ................ 365/189 X
4,321,695 3/1982 Redwine et al. ................ 365/240 X

*Primary Examiner*—Joseph A. Popek
*Attorney, Agent, or Firm*—Patrick T. King; Warren M. Becker

[57] ABSTRACT

A memory comprising a plurality of memory cells, a column decoder, a row decoder, a plurality of shift registers and a multiplexer is provided for addressing the memory cells in a conventional manner or in a high-speed sequential mode. In the sequential mode alternate cells from each of two sets of cells are addressed and their contents provided on a data output line, or data presented to them on a data input line, at a system clock rate which is much faster than the conventional mode.

11 Claims, 2 Drawing Figures

MEMORY WITH SEQUENTIAL MODE

BACKGROUND OF THE INVENTION

1. Field of the Invention

The present invention relates to random access memories in general which are operable in both a conventional and a sequential mode in particular.

2. Description of Prior Art

A conventional memory comprises a plurality of memory cells. Typically, for purposes of addressing, the cells are functionally arranged in columns and rows. A column decoder and a row decoder are provided for decoding the address of each one of the cells. When a cell is so addressed, the contents of the cell are read out to a data output line or bus, or data from a data input line or bus is written into the cell.

In many computer operations data may be stored and retrieved from a predetermined sequence of cells in a memory, giving rise to the possible advantage that such cells can be addressed in a manner which reduces the time required to retrieve or enter data therefrom or thereto.

Heretofore, the high-speed sequential retrieval of data in a memory has generally been used only in dynamic memories as distinguished from conventional static memories, the latter typically being unable to utilize this technique.

SUMMARY OF THE INVENTION

In view of the foregoing, principal objects of the present invention are a method and apparatus comprising a plurality of memory cells and means for addressing and retrieving or entering data therefrom or thereto at a rate corresponding to a system clock rate.

Another object of the present invention is a method and apparatus comprising a mamory which is selectively operable in either a conventional mode wherein individual cells are accessed using individual externally supplied addresses or a sequential mode wherein a sequence of cells is automatically accessed using clock driven shift registers.

In accordance with the above objects, there are provided a first and a second set of memory cells, a column decoder, a row decoder, a pair of column shift registers for addressing the column address lines, a pair of row shift registers for addressing the row address lines, a multiplexer having a first and a second input coupled to the data output lines of the first and second sets, respectively, a data register and means for shifting the shift registers and switching the multiplexer between its first and second inputs.

In operation, in the conventional mode, the decoders of the memory are used for decoding externally supplied addressed for accessing individual memory cells.

In the sequential mode, the decoders of the memory are used in a conventional manner for decoding the address of the first cell to be accessed in a predetermined sequence of cells and thereafter, the shift registers are used for addressing the remaining cells in the sequence. For example, assuming the first cell is located in a first one of the two sets of cells, the decoded first address is loaded into a corresponding one of the column shift registers and both of the row shift registers. Thereafter, and in response to a control signal SM, for example, the next cell in the sequence which is located in the second of the two sets of cells, is addressed and the multiplexer is set to read out to the data register the contents of the first cell. Upon the first clock pulse following the control signal SM, the contents of the first cell are read out to the data output line, the column shift register controlling the accessing of the first set of cells is shifted to address the next cell in the first set and the multiplexer is switched to read out the contents of the second cell in the second set to the data register. Upon the next clock pulse, the contents of the second cell are read out to the data output line, the shift register controlling the accessing of the second set of cells is shifted to address the next cell in the second set and the multiplexer is again switched to read out the contents of the third cell in the sequence in the first set of cells.

At the same time that the column shift register accessing the last column of cells in each of the sets is shifted to access the first column of cells in that set, the row shift register is also shifted to access the cells in another row of the cells in that set. In this manner, each column and row of cells in each set are addressed.

The above-described operations are continued for as long as the control signal SM is present thereby providing a retrieval of the contents of a sequence of memory cells at a system clock rate.

In practice, the system clock rate can be high enough to reduce the time required to access data from a sequence of cells in a memory; in other words, to access data from a memory at a rate which is much faster than is possible using conventional memory addressing methods and apparatus.

BRIEF DESCRIPTION OF THE DRAWINGS

The above and other objects, features and advantages of the present invention will become apparent from the following detailed description of the accompanying drawings in which.

DETAILED DESCRIPTION OF THE INVENTION

Figure 1:
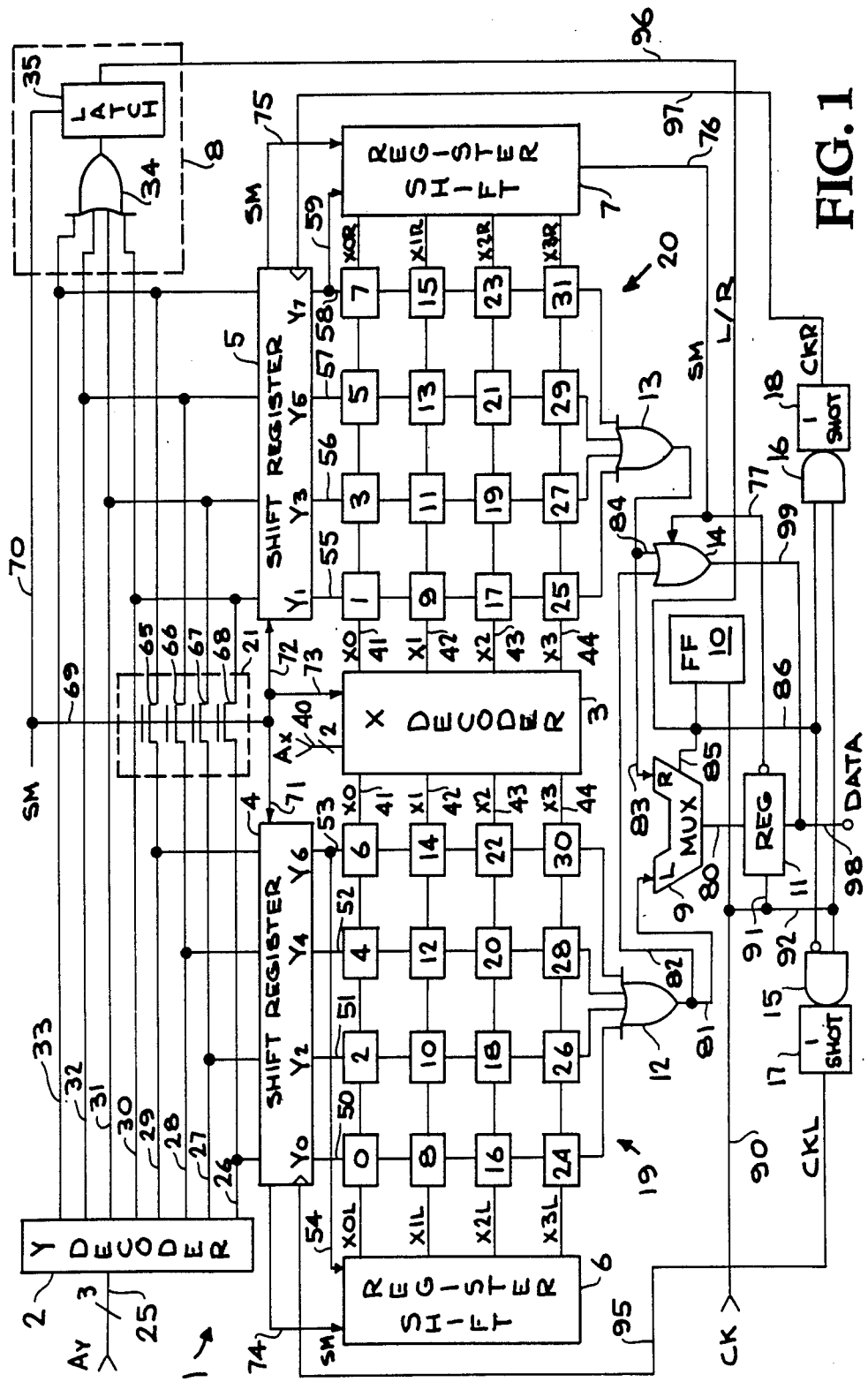
FIG. 1 is a block diagram of an embodiment of the present invention.

Referring to FIG. 1, there is provided in accordance with the present invention a memory designated generally as 1. In the memory 1 there is provided a Y or column decoder 2, an X or row decoder 3, a first column shift register 4, a second column shift register 5, a first row shift register 6 and a second row shift register 7, a multiplexer input selection circuit 8, a multiplexer 9, a toggle comprising a flip-flop 10, a data register 11, a plurality of OR gates 12, 13 and 14, a pair of AND gates 15, 16, a pair of one-shots 17 and 18, a first set of memory cells designated generally as 19, a second set of memory cells designated generally as 20 and a plurality of pass gates 21.

In the embodiment shown, the first and second sets of memory cells 19 and 20 are divided equally and conveniently designated by even and odd numbers, respectively. Thus, set 19 comprises even cells 0, 2, 4, . . . 30 and set 20 comprise odd cells 1, 3, 5, . . . 31.

In the decoder 2 there is provided a plurality of three address lines 25, also designated AY, and a plurality of eight output lines 26–33. Four of the output lines 26–29 are coupled to corresponding inputs of the shift register 4 and corresponding ones of the pass gates 21. The remaining four output lines 30–33 are coupled to corresponding inputs of the shift register 5 and an OR gate 34 in the multiplexer input selection circuit 8. The output of the OR gate 34 is coupled to a latch 35 in the selection circuit 8.

In the decoder 3 there is provided a plurality of two address lines 40, also designated AX, and a plurality of four output lines 41–44, also designated X0, X1, X2 and X3, coupled to four rows of memory cells in the sets 19 and 20. The memory cells in row X0 comprise cells 0–7. The cells in row X1 comprise cells 8–15. The cells in row X2 comprise cells 16–23 and the cells in row X3 comprise cells 24–31. The lines 41–44 are also coupled to corresponding inputs/outputs of the row shift registers 6 and 7 designated X0L, X1L, X2L, X3L and X0R, X1R, X2R, X3R, respectively.

In the shift register 4 there is provided a plurality of four output lines 50–53 which are coupled to a plurality of four corresponding columns of cells in the first set 19 designated Y0, Y2, Y4 and Y6. The line 53 is also coupled to a shift pulse input of the shift register 6 by means of a line 54.

In the shift register 5 there is provided a plurality of four output lines 55–58 which are coupled to a plurality of four corresponding columns of the cells in the second set 20 designated Y1, Y3, Y5 and Y7. The output line 58 is also coupled to a shift pulse input of the shift register 7 by means of a line 59.

In the pass gates 21 there is provided a plurality of four field effect tansistors 65–68. The transistors 65–68 are provided for coupling corresponding inputs of the shift registers 4 and 5 in response to a control signal SM, for example, on a line 69 coupled to the gates thereof. The control signal SM is also coupled to the clock input of the latch 35 in the multiplexer input selection circuit 8 by means of a line 70, to a control input of the shift registers 4 and 5 by means of a pair of lines 71, 72, a control input of the decoder 3 by means of a line 73, a control input of the shift registers 6 and 7 by means of a pair of lines 74, 75, a control input of the OR gate 14 by means of a line 76 and a control input of the register 11 by means of a line 77.

In the multiplexer 9 there is provided a first input L, a second input R and an output coupled to a data input of the register 11 by means of a line 80.

The data output lines of the cells in the first set of memory cells 19 are coupled to the inputs of the OR gate 12. The output of the OR gate 12 is coupled to the first input L of the multiplexer 9 by means of a line 81 and to an input of the OR gate 14 by means of a line 82. The data output lines of the cells in the second set of cells 20 are coupled to the inputs of the OR gate 13. The output of the OR gate 13 is coupled to the second input R of the multiplexer 9 by means of a line 83 and to an input of the OR gate 14 by means of a line 84.

The output of the flip-flop circuit 10 is coupled to a control input of the multiplexer 9 by means of a line 85 and to one input of the AND gates 15 and 16 by means of a line 86.

A source of system clock pulses is coupled to a clock input of the flip-flop circuit 10 by means of a line 90, to a clock input of the register 11 by means of a line 91 and to another input of the AND gates 15 and 16 by means of a line 92.

The output of the AND gate 15 is coupled to the input of the one-shot 17. The output of the one-shot 17 is coupled to a clock input of the shift register 4 by means of a line 95 for providing thereto a plurality of clock pulses CKL. The output of the AND gate 16 is coupled to the input of the one-shot 18. The output of the one-shot 18 is coupled to a clock input of the shift register 5 by means of a line 96 for providing thereto a plurality of clock pulses CKR. The clock pulses CKL and CKR correspond to alternate ones of the system clock pulses CK.

The output of the latch circuit 35 in the multiplexer input selection circuit 8 is coupled to the control input of the multiplexer 9 by means of a line 97. The output of the register 11 is coupled to a data output line 98. The output of the OR circuit 14 is coupled to the data output line 98 by means of a line 99.

In operation, the memory 1 can be operated in either a conventional mode or in a sequential mode.

In the conventional mode, individual memory cells 0–31 are individually addressed by addresses applied to the inputs AY and AX of the column and row decoders 2 and 3, respectively. In the embodiment shown, the outputs of the decoder 2 are coupled to the inputs of the shift registers 4 and 5 while the outputs of the decoder 3 are coupled directly to the row address lines of the cells in the first and second sets 19 and 20 when the signal SM has a high logical level. In this mode, the signal SM, when it has a high logical level, enables the shift registers 4–5 to parallel-load the outputs of the decoder 2, and disables the shift registers 6 and 7.

With the control signal SM at a high level, the data register 11 is disabled and the OR gate 14 is enabled to allow the contents of the selected memory cell in either set 19 or 20 to be transferred from the cell through gates 12 or 13 and gate 14 to the data output line 98, thereby bypassing the multiplexer 9 and data register 91.

In the sequential mode, the memory 1 is operated in such a manner that each cell in a predetermined sequence of cells is accessed at the rate of the system clock CK. For example, referring to FIG. 2 and assuming that the first cell in the predetermined sequence is cell 10 in the first set of cells 19, the address of cell 10 is applied to the inputs AY and AX of the decoders 2 and 3. With the address of cell 10 applied to the inputs of the decoders 2 and 3, the lines 27 and 42 will be high. With the control signal SM high, the outputs of the decoder 2 will be parallel-loaded into the shift register 4 causing the line 51 on the output of the shift register 4 to go high. With the output lines 51 and 42 high, cell 10 is selected.

Figure 2:
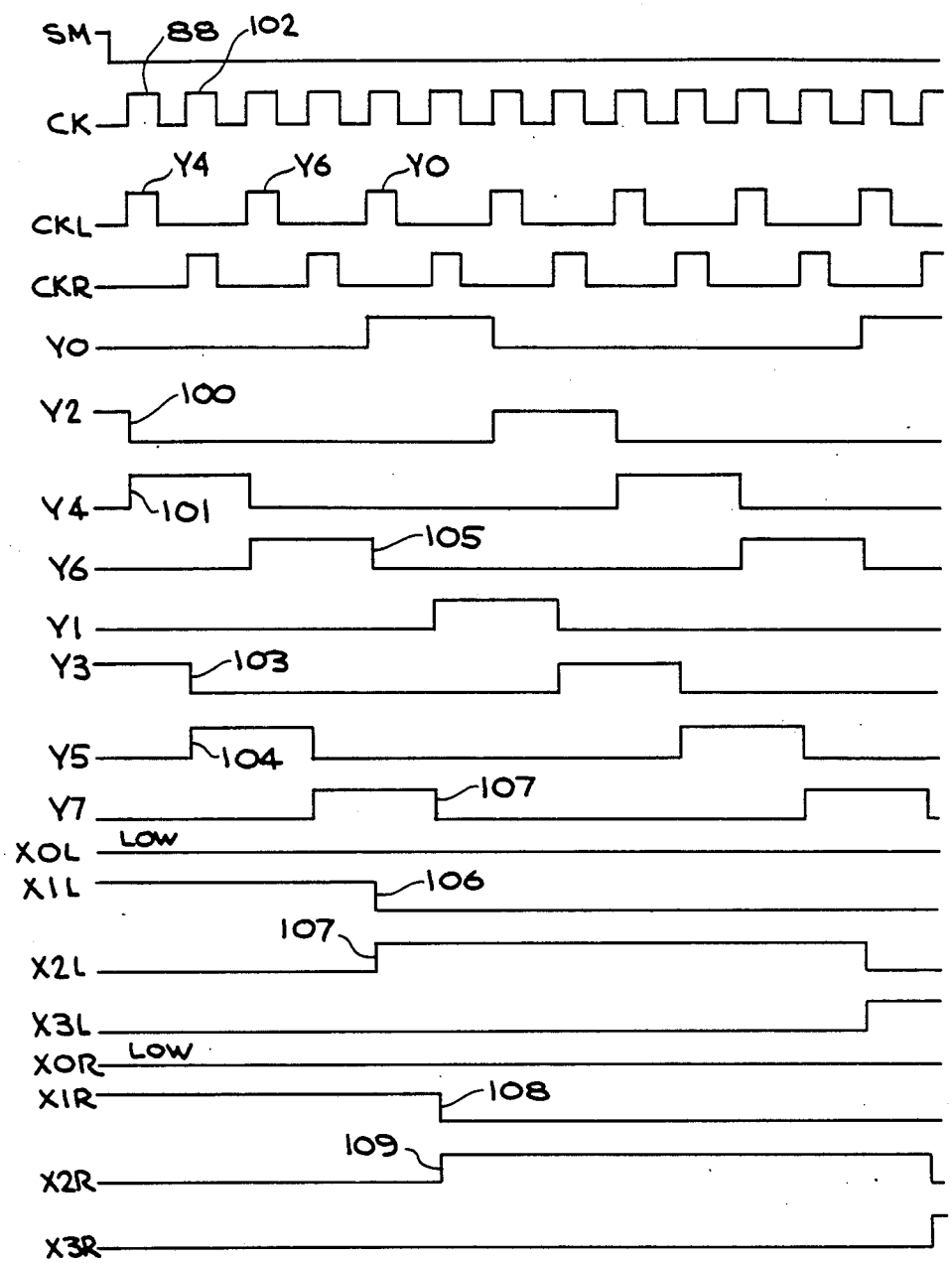
FIG. 2 is a timing diagram illustrating the operation of the embodiment of FIG. 1.

Referring to FIG. 2, immediately after the selection of cell 10 as described above, the control signal SM is driven low. When control signal SM goes low, the pass gates 21 are enabled, allowing the inputs to shift register 4 to be transferred to the inputs of shift register 5 such that the output line 56 of shift register 5 will also go high. With line 56 and line 42 high, memory cell 11 is also selected. At the same time, the inputs to OR gate 34 in the multiplexer input selection 8 will be low, causing the output of the latch circuit 35 to be low for providing a switching signal L which sets the multiplexer 9 to couple its first input L to its output 80. At this time, gate 14 is disabled and register 11 is enabled.

In response to the first clock pulse CK shown in FIG. 2 at 88, the contents of cell 10 are transferred from the register 11 to the data output line 98, the flip-flop circuit 10 is activated to switch the multiplexer 9 to couple the second input R to the output line 80 and a clock pulse CKL is generated on the line 95, causing the output Y2 of the shift register 4 to go low and the output Y4 of the shift register 4 to go high, as shown at 100 and 101 of FIG. 2.

With cell 11 having been preselected by the control signal SM, the contents of cell 11 are available at the input R of the multiplexer 9 and are transferred to the line 80 as soon as the multiplexer 9 is shifted from its left input L to its right input R. Upon the leading edge of the next clock pulse 102, the contents of the cell 11 are read out to the data output line 98 from the register 11, the flip-flop 10 switches the multiplexer 9 from its right input to its left input and a clock pulse CKR is provided on the line 96 for shifting the column shift register 5 causing the output Y3 to go low and the output Y5 to go high, as shown at 103 and 104 of FIG. 2, thereby deselecting cell 11 and selecting cell 13.

The above-described operations are repeated for accessing each of the cells in a row. When the last cell in a row of the first set, e.g. cell 14, is deselected by the output Y6 of the shift register 4 going from a high to a low as shown at 105 of FIG. 2, a shift pulse is generated on the line 54 for shifting the output of shift register 6 from row X1L to row X2L as shown at 106 and 107 of FIG. 2. Similarly, when cell 15 in row X1R of set 20 is deselected by output line Y7 going low as shown at 107, the transistion on line 59 causes the shift register 7 to shift from row X1R to row X2R, as shown at 108 and 109 of FIG. 2.

The above-described operations are repeated until the control signal SM goes inactive (from a low to a high in this example), signaling the termination of the sequential mode and returning the memory 1 to its conventional mode.

While an embodiment of the invention is described above, it is contemplated that various changes may be made thereto without departing from the spirit and scope of the present invention. For example, it will be noted that the initial setting of the multiplexer 9 to transfer the contents of a cell in set 19 or set 20 depends on whether the address applied to the column decoder 2 is even or odd. Accodingly, it is possible to initially set the multiplexer 9 by detecting the signal level of the least significant bit of the address applied to the inputs of the decoder 2 instead of detecting the signal levels on the output lines 30-33 thereof. If that is done, the circuit 8 may be eliminated. Further, while the invention as described comprises 32 memory cells, a particular embodiment of the present invention may comprise more or less than that number of memory cells. For the foregoing reasons, it is intended that the scope of the invention not be determined by reference to the embodiments described, but rather by reference to the claims hereinafter provided.

What is claimed is:

1. A memory comprising:
a plurality of rows and columns of memory cells;
a column decoder;
a row decoder;
first means responsive to an output from each of said column and row decoders for addressing a first row and column of said memory cells; and
second means responsive to a single control signal having a predetermined logical level and a plurality of clock pulses for automatically addressing each of said columns and each of said rows in a predetermined sequence to access the contents of the remainder of said memory cells.

2. A memory according to claim 1 wherein said plurality of clock pulses comprises a plurality of successive clock pulses and said second means comprises means for addresssing the remainder of said memory cells in response to a corresponding number of said successive clock pulses.

3. A memory comprising:
a plurality of rows and columns of memory cells;
means for addressing in response to an output from a column and a row decoder a first one of said memory cells in a predetermined sequence of said rows and columns of memory cells;
means for automatically addressing in response to a single control signal and a clock pulse a second one of said cells in said predetermined sequence;
means for automatically sequentially addressing in response to said control signal and a corresponding number of successive clock pulses each remaining cell in said sequence of said rows and columns of memory cells; and
means for automatically sequentially reading to a data output line in respone to said control signal and each of said successive clock pulses used for addressing the third and succeeding cells in said sequence of rows and columns of cells the contents of said cells in said sequence of rows and columns.

4. A memory according to claim 3 wherein each of said cells in said sequence comprises an address, and said means for addressing said first cell comprises:
means for decoding the address of said first cell by means of a column and a row decoder;
means for loading the outputs of said column and row decoders into a pair of column shift registers and a pair of row shift registers having outputs coupled to a first and a second set of said memory cells, respectively, said means for addressing said second cell in said sequence comprises:
means for coupling corresponding inputs of said first and said second column shift registers in response to said control signal, said means for sequentially addressing each remaining cell comprises:
means for shifting each of said column shift registers alternately in response to alternate ones of said successive clock pulses, respectively;
means for shifting each of said row shift registers in response to a predetermined output from a corresponding one of said column shift registers, respectively; and said means for reading the contents of said cells comprises:
means for coupling the outputs of said first and said second sets of memory cells to said data output line alterately in response to said alternate ones of said clock pulses, respectively.

5. A memory having a plurality of memory cells located in a first and a second set of said cells comprising:
means for addressing a first cell in said first set of cells;
means for setting a multiplexer having a first input coupled to the outputs of said cells in said first set and a second input coupled to the outputs of said cells in said second set to read out to a data register the contents of said first cell in said first set;
means for addressing, in response to a control signal, a first cell in said second set;
means for reading out to a data output line from said data register in response to said control signal and a first clock pulse the contents of said first cell in said first set;
means for switching said multiplexer in response to said first clock pulse to read out to said data register the contents of said first cell in said second set;

means for addressing in response to said first clock pulse a second cell in said first set;

means for reading out to said data output line from said data register in response to said control signal and a second clock pulse the contents of said first cell in said second set;

means for switching said multiplexer in response to said second clock pulse to read out to said data register the contents of a second cell in said first set;

means for addessing in response to said second clock pulse a second cell in said second set;

means for reading out to said data output line from said data register in response to said control signal and a third clock pulse the contents of said second cell in said first set;

means for switching said multiplexer in response to said third clock pulse to read out to said data register the content of a second cell in said second set;

means for addressing in response to said third clock pulse a third cell in said first set; and means for reading out to said data output line from said data register in response to said control signal and a fourth clock pulse the contents of said second cell in said second set.

6. A memory comprising:

a first and a second set of memory cells;

a column decoder having a plurality of output lines;

a row decoder having a plurality of output lines;

a first column shift register having a plurality of input and output lines;

a second column shift register having a plurality of input and output lines;

a first row shift register having a plurality of input and output lines;

a second row shift register having a plurality of input and output lines;

a multiplexer having a first input L and a second input R;

means coupling each output line of said row decoder to a corresponding row in said first and said second set of memory cells for addressing said row;

means coupling a first set of output lines of said column decoder to corresponding inputs of said first column shift register for loading said first column shift register in response to a control signal when said signal has a predetermined first level;

means coupling a second set of output lines of said column decoder to corresponding inputs of said second column shift register for loading said second column shift register in response to said control signal when said signal has said predetermined first level;

means coupling each output line of said first column shift register to a corresponding column in said first set of memory cells for addressing said corresponding column in said first set of memory cells;

means coupling each output line of said second column shift register to a corresponding column in said second set of memory cells for addressing said corresponding column in said second set of memory cells;

means coupling each output line of said first row shift register to a corresponding row in said first set of memory cells for addressing said corresponding row in said first set of memory cells;

means coupling each output line of said second row shift register to a corresponding row in second set of said memory cells for addressing said corresponding row in said second set of memory cells;

means for coupling the outputs of each of said memory cells in said first set to said first input L of said multiplexer;

means for coupling the outputs of each of said memory cells in said second set to said second input R of said multiplexer;

means which is responsive to said control signal for coupling the outputs of each of said memory cells in said first and said second set to a data output line when said control signal has said first predetermined level;

means which is responsive to a control signal for coupling corresponding inputs of said first and said second column shift registers when said control signal has a second predetermined level;

first means coupled to said second set of outputs of said column decoder and said multiplexer which is responsive to a control signal for providing a switching signal L/R and a means which is responsive to said control signal and a first clock CK for selectively switching said first and said second inputs L,R of said multiplexer to said data output line when any one of said second set of outputs of said column decoder is high and said control signal has said first predetermined level;

second means coupled to said multiplexer which is responsive to said control signal and said first clock CK for selectively coupling said first and said second inputs L,R of said multiplexer to said data output line when said control signal has said second predetermined level;

means which is responsive to said first clock CK for providing a second clock CKL to said first column shift register for shifting said first column shift register from a first column to a second column in said first set of memory cells when said first input L of said multiplexer is coupled to said data output line and said control signal has said second predetermined level;

means which is responsive to said first clock CK for providing a third clock CKR to said second column shift register for shifting said second column shift register from a first column to a second column in said second set of memory cells when said second input R of said multiplexer is coupled to said data output line and said control signal has said second predetermined level;

means coupling an output of said first column shift register to said first row shift register for shifting said first row shift register from a first row to a second row of memory cells in said first set when said control signal has said second predetermined level and said output of said first column shift register changes from a first (high) to a second (low) level; and means coupling an output of said second column shift register to said second row shift register for shifting said second row shift register from a first row to a second row of memory cells in said second set when said control signal has said second predetermined level and said output of said second column shift register changes from said first to said second level.

7. A method of reading the contents of a plurality of rows and columns of memory cells in a predetermined sequence comprising the steps of:

addressing in response to an output from a column and a row decoder a first one of said cells in said predetermined sequence;

addressing in response to a control signal a second one of said cells in said predetermined sequence;

sequentially addressing automatically in response to said control signal and a corresponding number of successive clock pulses each remaining cell in said rows and columns of memory cells; and sequentially reading automatically to a data output line in response to said control signal and each of said successive clock pulses used for addessing the third and succeeding cells in said rows and columns of cells the contents of said cells in said rows and columns.

8. A method according to claim 7 wherein each of said cells in said sequence comprises an address, said steps of addressing said first cell comprises the steps of:

decoding the address of said first cell by means of a column and a row decoder;

loading the outputs of said column and row decoders into a pair of column shift registers and a pair of row shift registers having outputs coupled to a first and a second set of said memory cells, respectively, said step of addressing said second cell in said sequence comprises the step of:

coupling corresponding inputs of said first and said second column shift registers in response to said control signal, said step of sequentially addressing each remaining cell comprises the steps of:

shifting each of said column shift registers alternately in response to alternate ones of said successive clock pulses, respectively;

shifting each of said row shift registers in response to a predetermined output from a corresponding one of said column shift registers, respectively; and said step of reading the contents of said cells comprises the step of:

coupling the outputs of said first and said second sets of memory cells to said data output line alternately in response to said altenate ones of said clock pulses, respectively.

9. A method of reading the contents of a plurality of memory cells located in a first and second set of said cells in a predetermined sequence, comprising the steps of:

(a) addressing a first cell in said first set of cells;

(b) setting a multiplexer having a first input coupled to the outputs of said cells in said first set and a second input coupled to the outputs of said cells in said second set to read out to a data register the contents of said first cell in said first set;

(c) addressing, in response to a control signal, a first cell in said second set;

(d) reading out to a data output line from said data register in response to said control signal and a first clock pulse the contents of said first cell in said first set;

(e) switching said multiplexer in response to said first clock pulse to read out to said data register the contents of said first cell in said second set;

(f) addressing in response to said first clock pulse a second cell in said first set;

(g) reading out to said data output line from said data register in response to said control signal and a second clock pulse the contents of said first cell in said second set;

(h) switching said multiplexer in response to said second clock pulse to read out to said data register the contents of said second cell in said first set;

(i) addressing in response to said second clock pulse a second cell in said second set;

(j) reading out to said data output line from said data register in response to said control signal and a third clock pulse the contents of said second cell in said first set;

(k) switching said multiplexer in response to said third clock pulse to read out to said data register the content of said second cell in said second set;

(l) addressing in response to said third clock pulse a third cell in said first set;

(m) reading out to said data output line from said data register in response to said control signal and a fourth clock pulse the contents of said second cell in said second set; and (n) repeating steps (e) through (m) so long as said control signal is active while incrementing the clock pulse and cell specified in each step.

10. A memory comprising:

a sequence of memory cells, each of said cells having an address;

means for decoding the address of a first cell by means of a column and a row decoder and means for loading the outputs of said column and row decoders into a pair of column shift registers and a pair of row shift registers having outputs coupled to a first and a second set of said memory cells, respectively, for addressing a first cell in said sequence;

means for coupling corresponding inputs of said first and said second column shift registers in response to a control signal for addressing a second cell in said sequence;

means for shifting each of said column shift registers alternately in response to alternate ones of said successive clock pulses, respectively, and means for shifting each of said row shift registers in response to a predetermined output from a corresponding one of said column shift registers, respectively, for sequentially addressing each remaining cell; and means for coupling the outputs of said first and said second sets of memory cells to said data output line alternately in response to said alternate ones of said clock pulses, respectively, for reading the contents of said cells.

11. A method of reading the contents of a sequence of memory cells, each of said cells in said sequence comprising an address, comprising the steps of:

decoding the address of a first cell by means of a column and a row decoder and loading the outputs of said column and row decoders into a pair of column shift registers and a pair of row shift registers having outputs coupled to a first and a second set of said memory cells, respectively, for addressing said first cell in said sequence;

coupling corresponding inputs of said first and said second column shift registers in response to said control signal for addressing a second cell in said sequence;

shifting each of said column shift registers alternately in response to alternate ones of said successive clock pulses, respectively, and shifting each of said row shift registers in response to a predetermined output from a corresponding one of said column shift registers, respectively, for sequentially addressing each remaining cell in said sequence; and coupling the outputs of said first and said second sets of memory cells to said data output line alternately in response to said alternate ones of said clock pulses, respectively, for reading the contents of said cells.

* * * * *